(12) United States Patent
Chen

(10) Patent No.: US 7,791,397 B2
(45) Date of Patent: Sep. 7, 2010

(54) HIGH SPEED DIGITAL LEVEL SHIFTER

(75) Inventor: Chung-Hui Chen, HsinChu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 10/901,700

(22) Filed: Jul. 28, 2004

(65) Prior Publication Data

US 2006/0022739 A1    Feb. 2, 2006

(51) Int. Cl.
*H03L 5/00*    (2006.01)

(52) U.S. Cl. ........................................ 327/333

(58) Field of Classification Search ................. 327/333; 326/80, 83, 85
See application file for complete search history.

(56) References Cited

U.S. PATENT DOCUMENTS

| | | | | |
|---|---|---|---|---|
| 5,175,512 A | * | 12/1992 | Self | 331/57 |
| 6,043,699 A | * | 3/2000 | Shimizu | 327/333 |
| 6,201,428 B1 | * | 3/2001 | Clark | 327/333 |
| 6,236,256 B1 | * | 5/2001 | Brownlow et al. | 327/333 |
| 6,255,888 B1 | | 7/2001 | Satomi | |
| 6,407,579 B1 | * | 6/2002 | Goswick | 326/81 |
| 6,501,306 B1 | * | 12/2002 | Kim et al. | 327/112 |
| 6,617,896 B2 | * | 9/2003 | Uenishi et al. | 327/170 |
| 6,864,718 B2 | * | 3/2005 | Yu | 326/83 |
| 2003/0042965 A1 | * | 3/2003 | Kanno et al. | 327/333 |
| 2004/0027163 A1 | * | 2/2004 | Carpenter et al. | 326/83 |

OTHER PUBLICATIONS

Pylarinos, L., "Charge Pumps: An Overview," University of Toronto http://www.eecg.toronto.edu/~kphang/ece1371/chargepumps.pdf, Apr. 12, 2001.

* cited by examiner

*Primary Examiner*—Lincoln Donovan
*Assistant Examiner*—Khareem E Almo
(74) *Attorney, Agent, or Firm*—Slater & Matsil, L.L.P.

(57) ABSTRACT

A high-speed digital level shifter is described. The preferred embodiment shifts an input signal with a lower amplitude to a signal with a higher amplitude. The level shifter includes a signal driver circuit to drive up the input signal to a driver signal having higher voltages. The driver signal is used to drive an output circuit that generates an output signal having amplitude of a high voltage power source. The output circuit has improved performance being driven by the driver input signal. A signal stepper is added to further improve the performance by pulling up the output voltage in two stages.

9 Claims, 5 Drawing Sheets

HIGH SPEED DIGITAL LEVEL SHIFTER

TECHNICAL FIELD

This invention relates generally to digital circuits, and more specifically to digital level shifters.

BACKGROUND

A level shifter is a circuit that converts an input signal having the voltage amplitude of $VDD_1$ into an output signal having the voltage amplitude of $VDD_2$. Typically, the amplitude is converted by fixing the lower potential side, typically referred to as VSS, and converting the potential at the higher potential side. Level shifters are widely used in integrated circuits where more than one application circuit, each having different amplitudes, are integrated together.

A common application is shifting the voltage of a signal transferred between an input/output ("IO") circuit and a core circuit. Historically, the IO operation voltage was compatible with the core operation voltage. However, with the shrinking of the VLSI circuit, the operation voltage of the core circuit continues to be reduced while the IO operation voltage stays relatively steady, so that currently, the core operation voltage is typically much lower than the IO operation voltage. For example, in deep sub-micron technology, the core operation voltage has dropped to about 0.9 to 1V, and the IO operation voltage stays at about 2.5V to 3.3V. Therefore a signal needs to be level shifted before it is sent from a core circuit to an IO circuit or from an IO circuit to a core circuit. Usually, VSS is set at ground potential or 0V, and VDD is set at 0.9 to 1V for the core and 2.5 to 3.3V for the IO. In other instances, VSS may be set to a higher voltage level or a negative voltage level. In such cases, only the level of VDD need be adjusted. In other instances, the level of VSS is adjusted, or the levels of both VSS and VDD are adjusted.

FIG. 1 illustrates a conventional digital level shifter circuit. Nodes 2 are power supply nodes at a power supply voltage VDD, which is a core operation voltage. Nodes 26 are power supply nodes at a power voltage VDDH, which is an IO operation voltage and is higher than VDD. Node 12 is an input node and node 30 is an output node. When the input signal at node 12 switches from 0 (0 volt) to 1 (VDD), the voltage at node 14 changes from VDD to 0V since pMOS 4 and RMOS 8 form an inverter. The gate voltage of the transistor 20 at node 28 also changes to 0 volt, causing the nMOS transistor 20 to cut off. The pMOS transistor 6 and nMOS transistor 10 form another inverter, so that the voltage at node 16 changes to VDD, causing transistor 18 to conduct. The voltage at node 32 is pulled down so that pMOS transistor 24 conducts. The output voltage at node 30 is pulled up to VDDH by transistor 24.

If input signal at node 12 switches from 1 to 0, voltage at node 14 changes to 1, causing transistor 20 to conduct and the output voltage at node 30 is pulled down. Simultaneously, the voltage at node 16 switches to 0V, causing transistor 18 to cut off, and the voltage at node 32 is pulled up by the pMOS transistor 22. Transistor 24 is cut off due to the high gate voltage at node 32, and the voltage at output node 30 is eventually pulled down to 0 volt. Therefore, the input signal with amplitude of VDD is shifted to an output signal with amplitude of VDDH.

The circuit illustrated in FIG. 1 performs well when VDD is higher than the threshold voltage of the transistor 18 and 20 with adequate margin. However, when a VLSI circuit gets smaller, the gate oxide of the core CMOS gets thinner. The supply voltage of the core CMOS is also lowered to protect the gate oxide from damage and the hot carrier effect. When VDD is dropped to a level close to the threshold voltage of nMOS 18 and 20, the conventional low-to-high level shifter becomes slow. To explain in detail, assume the input voltage at node 12 is VDD, so that transistors 20 and 22 are off and transistors 18 and 24 are on. When the input voltage at node 12 is switched to 0V, the state of the transistor 20 changes from off to on so that it starts to pull down the voltage at node 30. The drain current of a transistor can be expressed as:

$$I_d = k*[2(V_{gs}-V_t)V_{ds}-V_{ds}^2] \quad \text{[Eq. 1]}$$

where k is a device parameter, $I_d$ is the drain saturation current of the transistor, $V_{gs}$ is the voltage difference between the gate and source, and $V_t$ is the threshold voltage of the transistor. It is observed that the current is directly related to $V_{gs}-V_t$. If the voltage VDD at node 28 is close to $V_t$, the drain-source current $I_d$ is very small, and it is hard for transistor 20 to pull down the output voltage at node 30, so that the level shifter is slow and high frequency response is degraded. One of the common solutions is to increase the aspect ratio W/L to increase the transistor 20's drain-source current. This is because k can be expressed as:

$$k = \tfrac{1}{2}\mu_n C_{ox}(W/L) \quad \text{[Eq. 2]}$$

where $\mu_n$ is the electron mobility, $C_{ox}$ is the capacitance per unit area of the capacitor between the gate electrode and the channel, W is the channel width, L is the channel length, and W/L is the gate aspect ratio. When W/L increases, k increases and the $I_d$ increases. When the core circuit's operation voltage continues to drop, W/L needs to be further increased to compensate.

Since power supply voltage VDDH stays higher, the transistors 18, 20, 22 and 24 are normally thick oxide transistors so that they can withstand higher operation voltages without being damaged. However, the thick oxide transistors also have higher threshold voltages, making the threshold voltage closer to VDD. If the VDD is equal to or lower than the threshold voltage of transistors 18 and 20, the transistors cannot be turned on, so that the level shifter will malfunction. Therefore, there is the need for a level shifter that has high performance even when operated at a very low core operation voltage.

SUMMARY OF THE INVENTION

A high-speed digital level shifter is described. The preferred embodiments can shift an input signal with lower amplitude VDD to a signal with higher amplitude VDDH. The preferred embodiments include a signal driver circuit to drive up the input signal to a driver signal having higher voltages. The driver signal is used to drive an output circuit that generates an output signal having amplitude of VDDH. The performance of the output circuit is improved since the driver signal is higher. A signal stepper is added to further improve the performance by pulling up the output voltage in a two-stage process.

In one aspect of the preferred embodiment, the driver circuit is implemented using charge pumps. The driver circuit drives up an input signal in a range between 0V and VDD to a driver signal in a range between (VDD-$V_{th}$) and (2VDD-$V_{th}$). The signal stepper is implemented using two inverters. When the input signal switches from 0 to 1, the output is pulled to a voltage close to VDD through a pass gate, then pulled up to VDDH. The design of the preferred embodiment of the present invention is simple and implementation is easy.

The frequency response of the preferred embodiments of the present invention is improved over the prior art. The preferred embodiment works well for 1.25 Gbps signals, and it can be used for deep sub micron technology.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The preferred embodiments are illustrated in FIGS. 2 through 5, wherein like reference numbers are used to designate like elements throughout the various views and illustrative embodiments of the present invention. It is to be appreciated that for simplicity, it is assumed that the input signal switches between 0V and VDD, and the VSS of the circuit is 0V. Those skilled in the art will appreciate that different values may be used.

Figure 2:
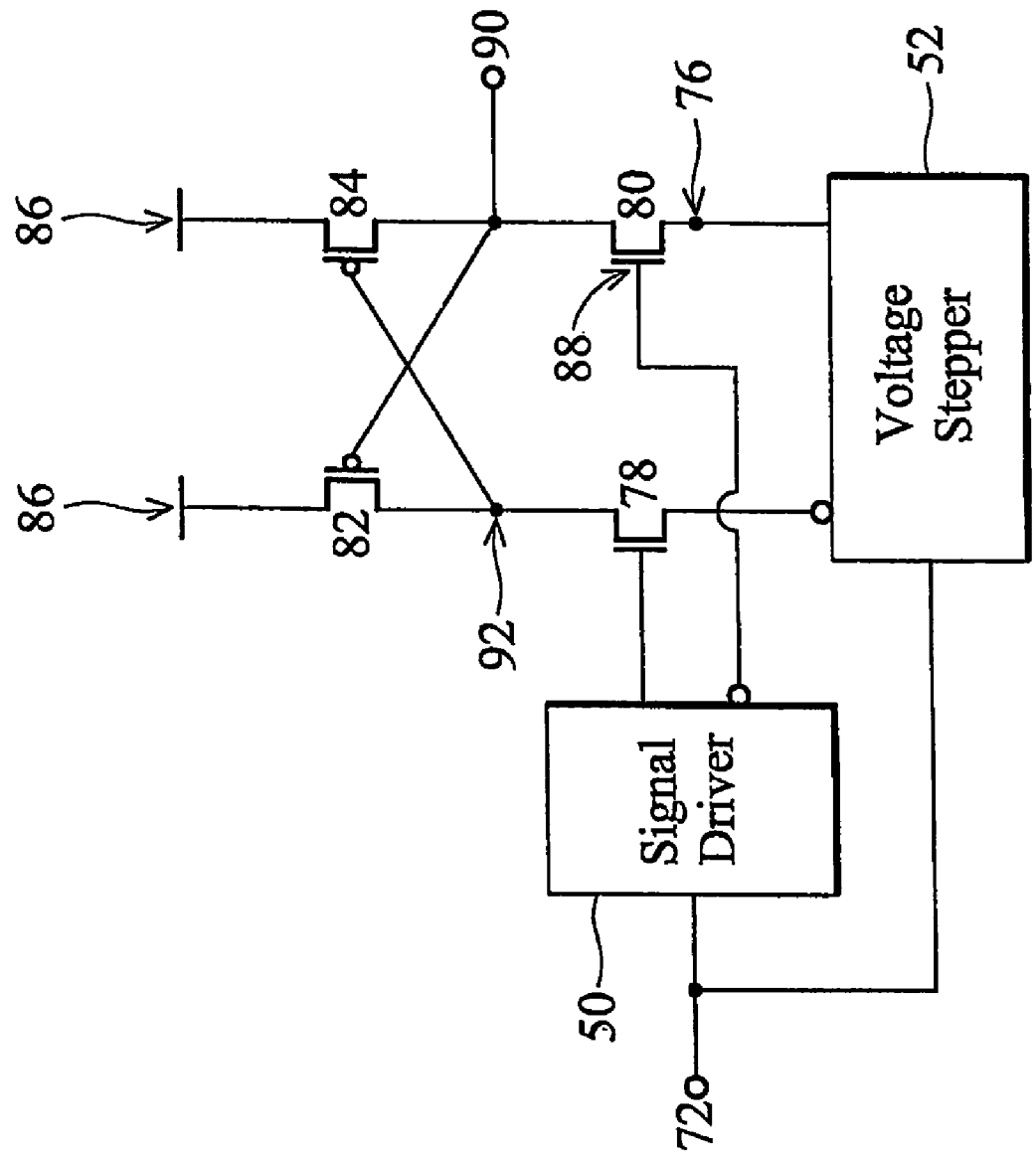
FIG. 2 is a schematic diagram of a preferred embodiment.

FIG. 2 illustrates a preferred embodiment of the present invention. An output circuit is used to generate an output signal. The output circuit is formed of a symmetrical pair of pMOS transistors 82, 84 and a pair of nMOS transistors 78 and 80. A signal driver 50 is used to drive up the input signal voltage. The input signal, as is conventional, consists of a logical pair of voltage levels, i.e., logical low and logical high. In the illustrated embodiments, a logical low is about 0V and a logical high is about the VDD voltage level for a core device (e.g., 1V). The output signal also consists of a logical pair of voltage levels, logical low and logical high, and in the illustrated embodiment, the logical low at the output is about 0V and the logical high at the output is about the VDDH (e.g., 3.3V) for an IO device.

As will be explained in greater detail below, the low voltage of the input signal is boosted to voltage $V_{low}$. The high voltage of the input signal is boosted to voltage $V_{high}$, where $V_{high}$ is preferably higher than VDD and also higher than the threshold voltage of the transistors 78 and 80. The un-inverted boosted output of the signal driver 50 is coupled to the gate of transistor 78 and the inverted boosted output of signal driver 50 is coupled to the gate of transistor 80. Since the output (whether inverted or un-inverted) of the signal driver 50 is higher than VDD, the $V_{gs}$ of transistors 78 and 80, respectively, are higher, so their respective drain-source current is increased. This allows for faster switching of the output node 90.

To further improve the performance of the level shifter, a voltage stepper 52 is added to increase the speed at which either output node 90 or its counterpart node 92 is changed from 0V to VDDH. The voltage stepper 52 is coupled to the input signal at node 72 so that its output (or more accurately its two outputs, one of which is simply the inverse of the other) is also controlled by the input signal. The function of voltage stepper 52 can be explained briefly as follows. When input voltage $V_{in}$ at node 72 switches from 0V to VDD, transistor 80 switches from on to off, because its gate voltage (at node 88) is driven low by the inverted output from signal driver 50. Likewise, the non-inverted output from signal driver 50 turns on transistor 78, hence turning on gate 84. Voltage $V_{out}$ at node 90 is brought "high," i.e., from about 0V to about VDDH (less the voltage drop across transistor 84). The process whereby transistor 84 pulls output node 90 high can be divided conceptually into an initial stage and a final stage. In the initial stage, where the gate of transistor 84 is first transitioning from high to low, the drain-source current is small. In the final stage, as the gate voltage of transistor 84 reaches its logical low level, transistor 84 is fully turned on and its drain-source current is high, thus pulling output node 90 to its logical high level more quickly. In other words, at high operation frequencies, the switching speed of transistor 84 (or of transistor 82 when switching from high to low), can significantly impact the speed at which the output node 90 can switch.

Output node switching speed can be enhanced by the use of voltage stepper 52 by in effect "pushing" the output node to an intermediate voltage level (i.e., intermediate the logical low voltage of e.g., 0V and the logical high voltage level of e.g., VDDH) during the initial stage while transistor 84 is turning on. This "pushing" effect is accomplished by transistor 80 which acts as a pass gate, also known as a source follower because the drain voltage follows its source voltage. As source follower transistor 80 is transitioning from its on state to its off state, its source (node 76) is driven high by voltage stepper 52. The drain of transistor 80 (which is at output node 90) follows the source voltage, so the drain voltage/output voltage is "pushed" to a higher voltage by transistor 80. At some point, pull-up transistor 84 turns on fully (i.e., the final stage discussed above) and transistor 80 turns off fully. At this point, output voltage node 90 is at some intermediate voltage (between 0V and VDDH), and transistor 84 need only pull the output node up the remainder of the way to its high level. This significantly increases the switching speed.

The preferred embodiment illustrated in FIG. 2 provides two advantageous features. The first advantageous feature is that signal driver 50 increases the voltage level to the gates of output stage transistors 78 and 80, thus ensuring that the gate voltage is above the threshold voltage and increasing the drain-source current. The increased drain-source current allows transistor 78 to more rapidly pull node 92 low and transistor 80 to more rapidly pull node 90 low. Secondly, voltage stepper 52 drives the source of output state transistors 78 and 80, respectively, high during switching, thus driving node 90 or 92, respectively, to an intermediate voltage state above 0V (logical low) during the transition of node 90 or 92 from a logical low to a logical high state. This allows pull-up transistor 84 or 82, respectively, to pull node 90 or 92, respectively, to the logical high state more quickly.

Figure 4:
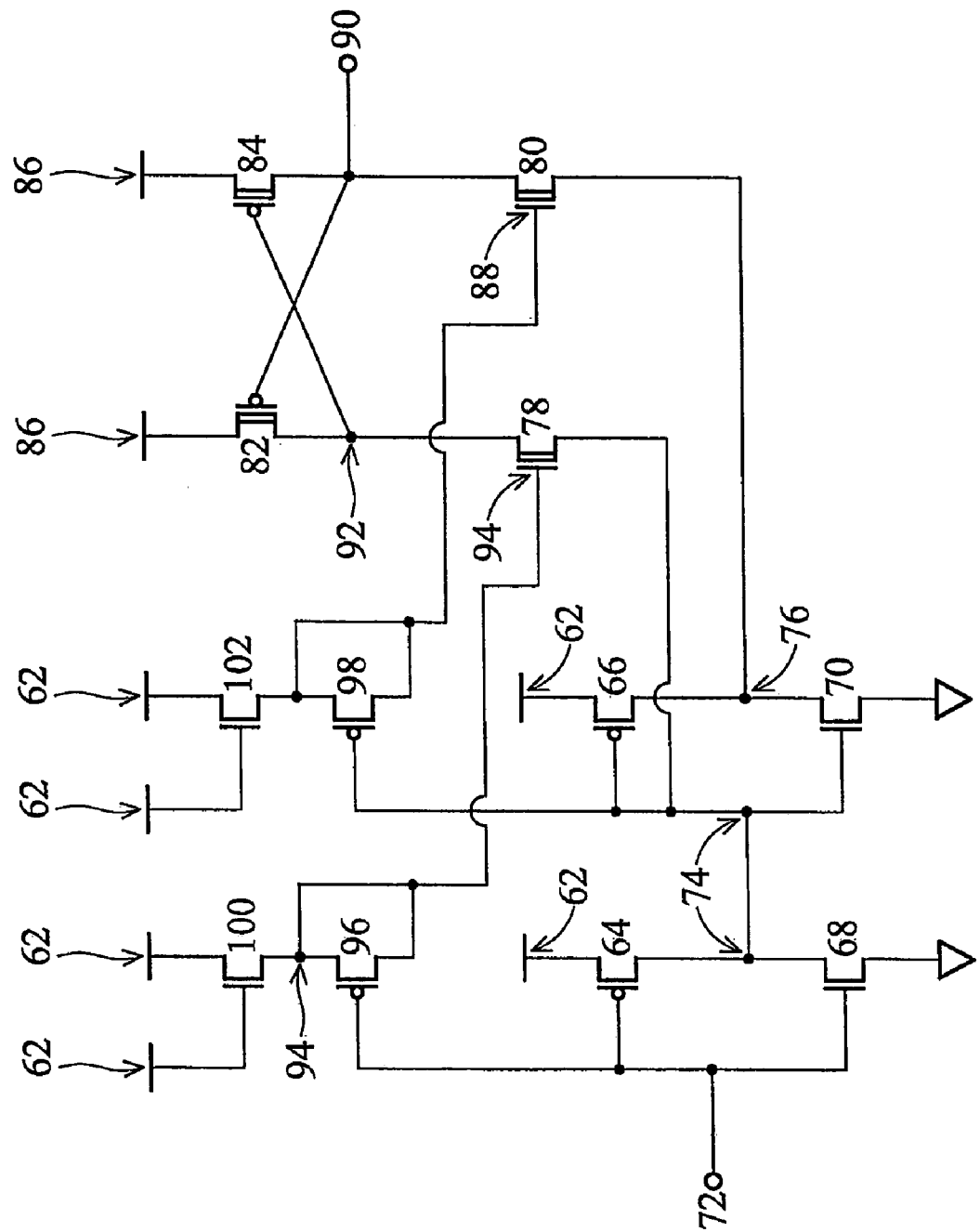
FIG. 4 is an implementation of a preferred embodiment using charge pumps.

One skilled in the are will recognize that signal driver 50 and voltage stepper 52 can be implemented in various ways. One preferred embodiment is illustrated in FIG. 4. The preferred embodiment uses charge pumps to drive up the gate to source voltage, $V_{gs}$, of transistors 78 and 80, respectively, so that the drain-source current is increased. A charge pump is a circuit that generates a voltage higher than the supply voltage from which it operates. With a proper design, a charge pump can generate a voltage multiple times higher than the power supply voltage. Normally, to obtain a voltage multiple times higher than the power supply voltage, multiple stages are used to pump the voltage higher and higher until the desired voltage is reached.

Figure 3:
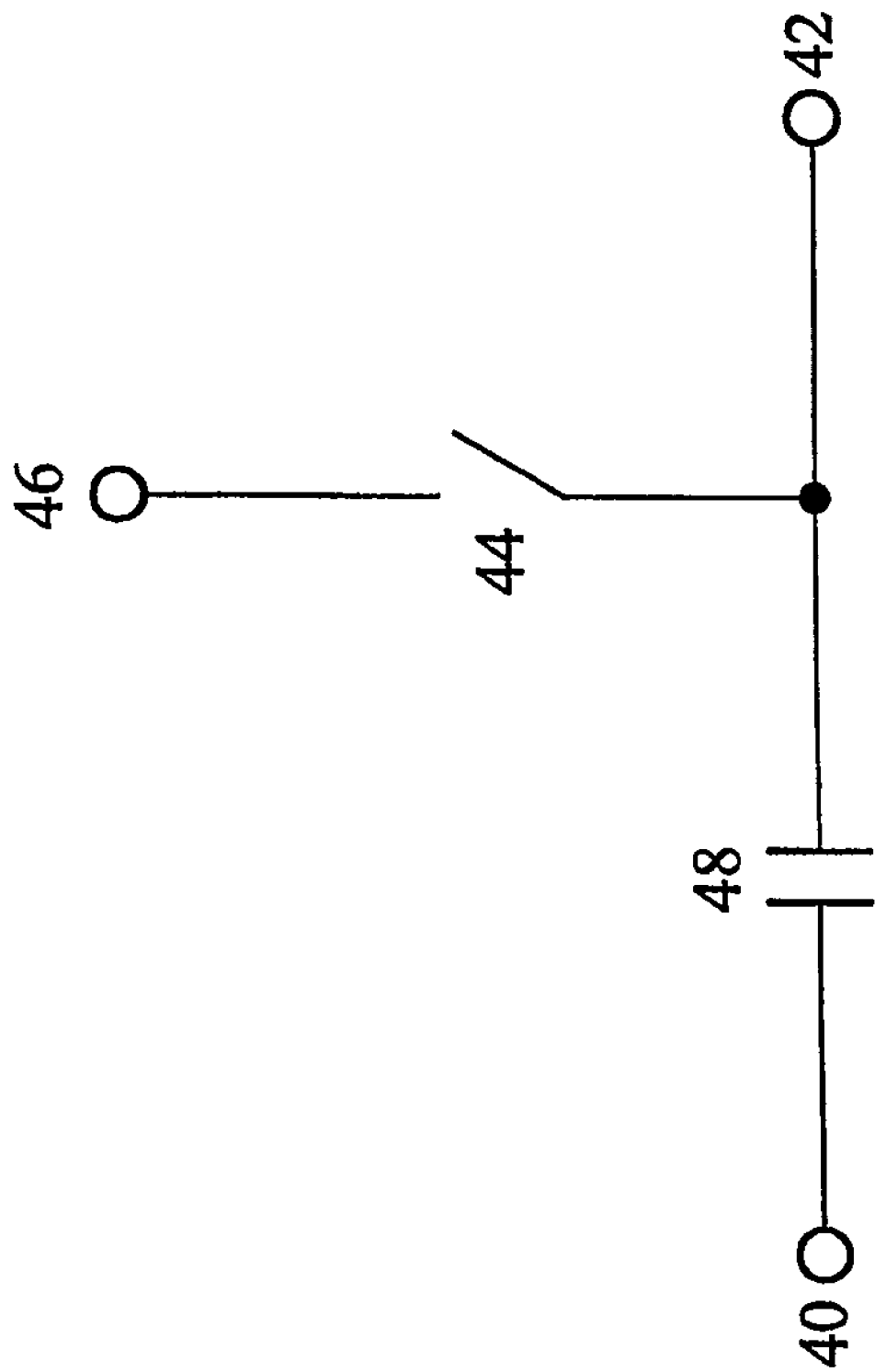
FIG. 3 illustrates a schematic view of a simplified charge pump.

FIG. 3 illustrates a simplified one-stage charge pump used in the preferred embodiment. Node 40 is the input signal node, and the input signal switches between 0V and VDD. Node 42 is the output node with voltage $V_{out}$. The power supply at node 46 has a supply voltage VDD. Switch 44 has two phases, closed and open. During the first phase, switch 44 is closed so that the capacitor 48 is charged, and the charge Q equals VDD*C, where C is the capacitance of the capacitor 48. During the second phase, the switch 44 is opened, and the voltage $V_{in}$ of the input signal is switched to VDD. Since the charge stored in the capacitor is a constant, there is:

$$(V_{out} - V_{in})^*C = VDD^*C \qquad [\text{Eq. 3}]$$

or $$V_{out} = VDD + V_{in} \qquad [\text{Eq. 4}]$$

In the case when $V_{in}$ equals VDD, $V_{out}$ equals 2VDD. When $V_{in}$ switches between 0V and VDD, $V_{out}$ switches between VDD and 2VDD.

FIG. 4 illustrates a preferred embodiment using the charge pump. Nodes 62 are connected to a power supply with a lower supply voltage VDD. Nodes 86 are connected to a power supply with higher voltage VDDH, which is higher than VDD. The signal driver 50 is implemented using capacitors 96, 98, and NMOS transistors 100 and 102. Preferably, capacitors 96 and 98 are formed of pMOS transistors with their drains and sources shorted, and they are charged by power supply VDD through nMOS transistors 100 and 102. Transistors 78, 80, 82 and 84 form the output circuit driving a voltage $V_{out}$ at node 90. The voltage stepper is implemented by transistors 64, 68, 66 and 70, which form two inverters. Preferably, the devices operated under the supply voltage VDD are formed of thin oxide transistors in order to have higher speed, and the devices operated at supply voltage VDDH are formed of thick oxide transistors to avoid damage.

As shown in FIG. 4, the gate voltages of transistors 78 and 80 at nodes 94 and 88, respectively, are charge pumped by the pMOS capacitors 96 and 98. During the first phase, assume the input node 72 is low (0V), the transistor 100 conducts, and the voltage at node 94 is (VDD−$V_{thn}$), where $V_{thn}$ is the threshold voltage of the transistors 100 and 102. The capacitor 96 is charged to:

$$Q = (VDD - V_{thn})^*C \qquad [\text{Eq. 5}]$$

where Q is the charge on capacitor 96 and C is the capacitance.

When input signal voltage $V_{in}$ at node 72 is switched to VDD, the voltage at node 94 changes to a voltage $V_{94}$, where $V_{94}$ is higher than (VDD−$V_{thn}$), so that the $V_{gs}$ of the transistor 100 is lower than $V_{thn}$, therefore the transistor 100 cuts off, and it is equivalent to switch 44 under "open" state (refer to FIG. 3). The charge stored in capacitor 96 is isolated, so that $V_{94}$ is derived by:

$$(V_{94} - V)^*C = Q = (VDD - V_{thn})^*C \qquad [\text{Eq. 6}]$$

and it can be expressed as $$V_{94} = VDD - V_{thn} + V_{in}. \qquad [\text{Eq. 7}]$$

Since $V_{in}$ equals VDD, $$V_{94} = 2VDD - V_{thn} \qquad [\text{Eq. 8}]$$

When input signal $V_{in}$ is switched back to 0V, the voltage at node 94 changes back to (VDD−$V_{thn}$) again. Therefore, the voltage at node 94 switches between (VDD−$V_{thn}$) and (2VDD−$V_{thn}$). Similar analysis reveals that the voltage at node 88 is also in a range between (VDD−$V_{thn}$) and (2VDD−$V_{thn}$). However, since node 88 is charge pumped by an inverted voltage of the input signal (i.e., the input voltage to capacitor 98 that charge pumps node 88 is inverted by inverter pair 64, 68), node 94 and node 88 have opposite phases so that when one is at (VDD−$V_{thn}$), the other is at (2VDD−$V_{thn}$).

The function of the charge pump and the voltage stepper can be explained as follows. When the input signal $V_{in}$ at node 72 switches from 0 to VDD, the node 94 is charge pumped by the pMOS capacitor 96 from (VDD−$V_{thn}$) to (2VDD−$V_{thn}$), and the voltage at node 74 is switched to 0V by the inverter formed by transistors 64 and 68. Note that node 94 is connected to the gate of NMOS transistor 78 and that node 74 is connected to the source of nMOS transistor 78. Therefore, the state of the thick oxide nMOS transistor 78 switches from off to on and pulls node 92 down. The dropping of the voltage at node 92 causes $V_{gs}$ of transistor 84 to increase. When the gate voltage of transistor 84 is higher than the threshold voltage, transistor 84 conducts and pulls up the voltage $V_{out}$ at node 90 to VDDH. Since the $V_{gs}$ of the transistor 78 is (2VDD−$V_{thnd}$), which is higher than VDD in the prior art, the drain-source current is higher. It is easier for transistor 78 to pull down the voltage at node 92.

At the same time the voltage at node 94 changes from (VDD−$V_{thn}$) to (2VDD−$V_{thn}$), the voltage at node 88 changes from (2VDD−$V_{thn}$) to (VDD−$V_{thn}$). The output voltage $V_{out}$ is pulled up to VDDH in two stages. During the first stage, it is pushed up to a mid-level voltage $V_{step}$ close to VDD. At the beginning of the first stage, the voltage at node 88 is (2VDD−$V_{thn}$), and the source voltage at node 76 is 0V. The transistor 80 is on and the drain-source current is high, so that transistor 80 is a pass gate and its drain voltage follows its source voltage. As time passes, transistor 80's gate voltage at node 88 decreases from (2VDD−$V_{thn}$) to (VDD−$V_{thn}$), and transistor 80's source voltage at node 76 increases from 0V to VDD. Thus the voltage $V_{out}$ at node 90 is pushed to $V_{step}$ by the pass gate 80 until the transistor 80 is off (which occurs when transistor 80 eventually reaches a gate voltage of (VDD−$V_{thn}$) and a source voltage of VDD. During the second stage, the output voltage $V_{out}$ is pulled up by transistor 84 (which is fully on at this point) from $V_{step}$ to VDDH. By the time $V_{out}$ is pushed to $V_{step}$ and the transistor 80 has cut off, transistor 78 has pulled the voltage at node 92 rather low, so that the transistor 84 has sufficient drain-source current to further pull up $V_{out}$ to VDDH promptly.

A similar analysis reveals that the same advantageous features are realized when input node 72 switches from high to low. In this case, node 88 is charge pumped by pMOS capacitor 98 from (VDD−$V_{thn}$) to (2VDD−$V_{thn}$) and voltage at node 76 is switched from high to low by the cascaded inverter pairs 64, 68 and 66, 70. Transistor 80 thus switches on and pulls output node 90 low (with large drain-source current because of the large $V_{gs}$ provided by the charge pump). At the same time, pMOS capacitor 96 drives node 94 to (VDD−$V_{thn}$) to turn transistor 78 off. While transistor 78 is turning off, however, node 74 (which is tied to the source of transistor 78) is driven high by inverter pair 64, 68. Because transistor 78 also acts as a source follower during switching, the drain of transistor 78, which is at node 92, is forced high to an intermediate level (again called $V_{step}$ for sake of convenience, although not necessarily the same intermediate voltage level to which node 90 was driven during low to high switching). This means that pull-up transistor 82 need only pull node 92 from $V_{step}$ to VDDH, which in turn quickly turns transistor 84 off.

The preferred embodiment illustrated in FIG. 4 uses one stage of charge pump. With technology advances and core operation voltage further dropping, the output voltages of the charge pumps, which are between (VDD-$V_{thn}$) and (2VDD-$V_{thn}$) may not be high enough to drive the output circuit, and multiple stage charge pumps can be used to push the driver voltages at nodes 88 and 94 higher. The design of the multiple stage charge pumps are known in the art, and the details are not discussed. It is also to be noted that although the voltage stepper uses the same source supply voltage VDD as the signal driver in the preferred embodiment, in other embodiments, the voltage stepper can be operated at a power supply voltage different from VDD.

Figure 1:
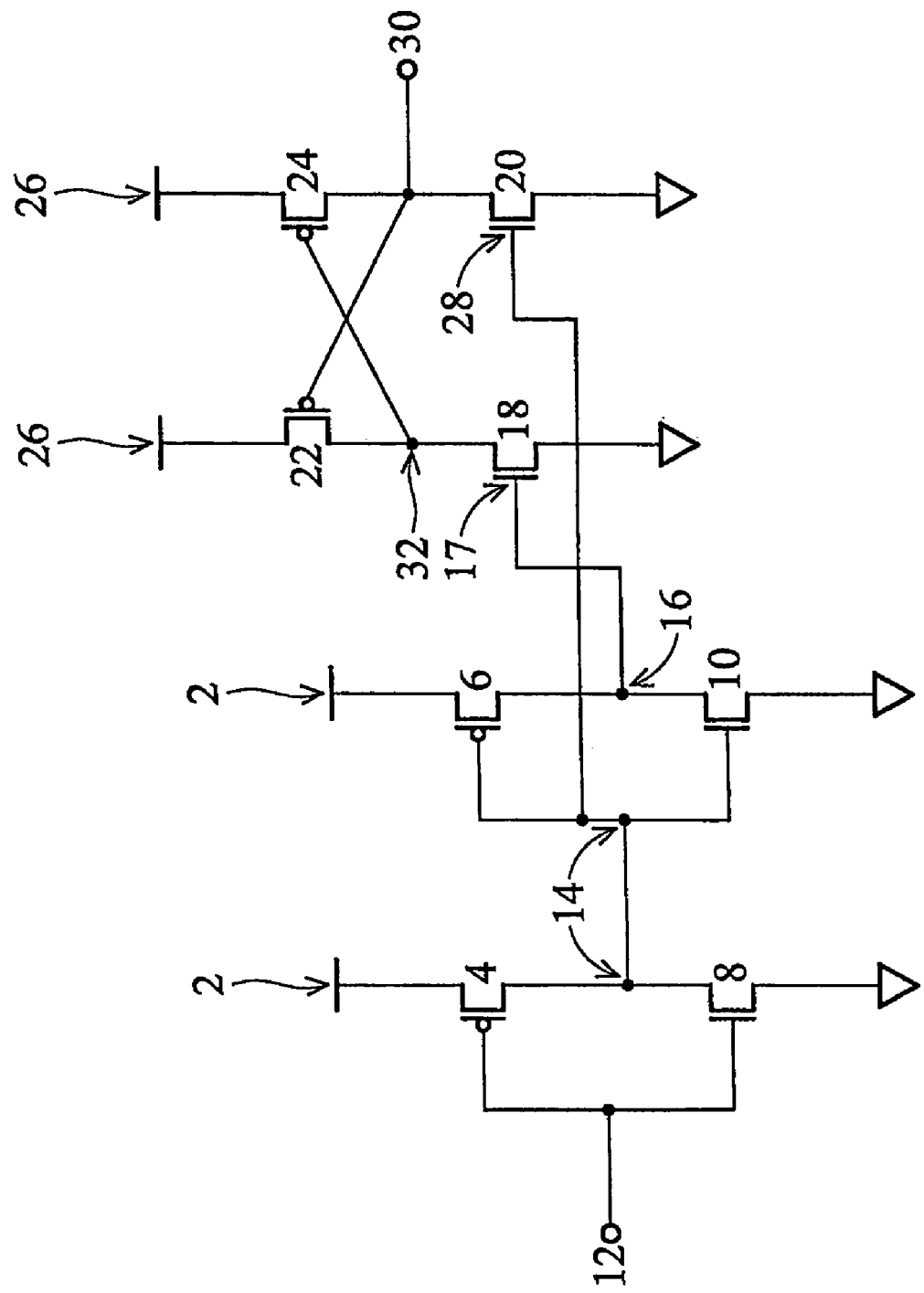
FIG. 1 illustrates a conventional level shifter.
Figure 5:
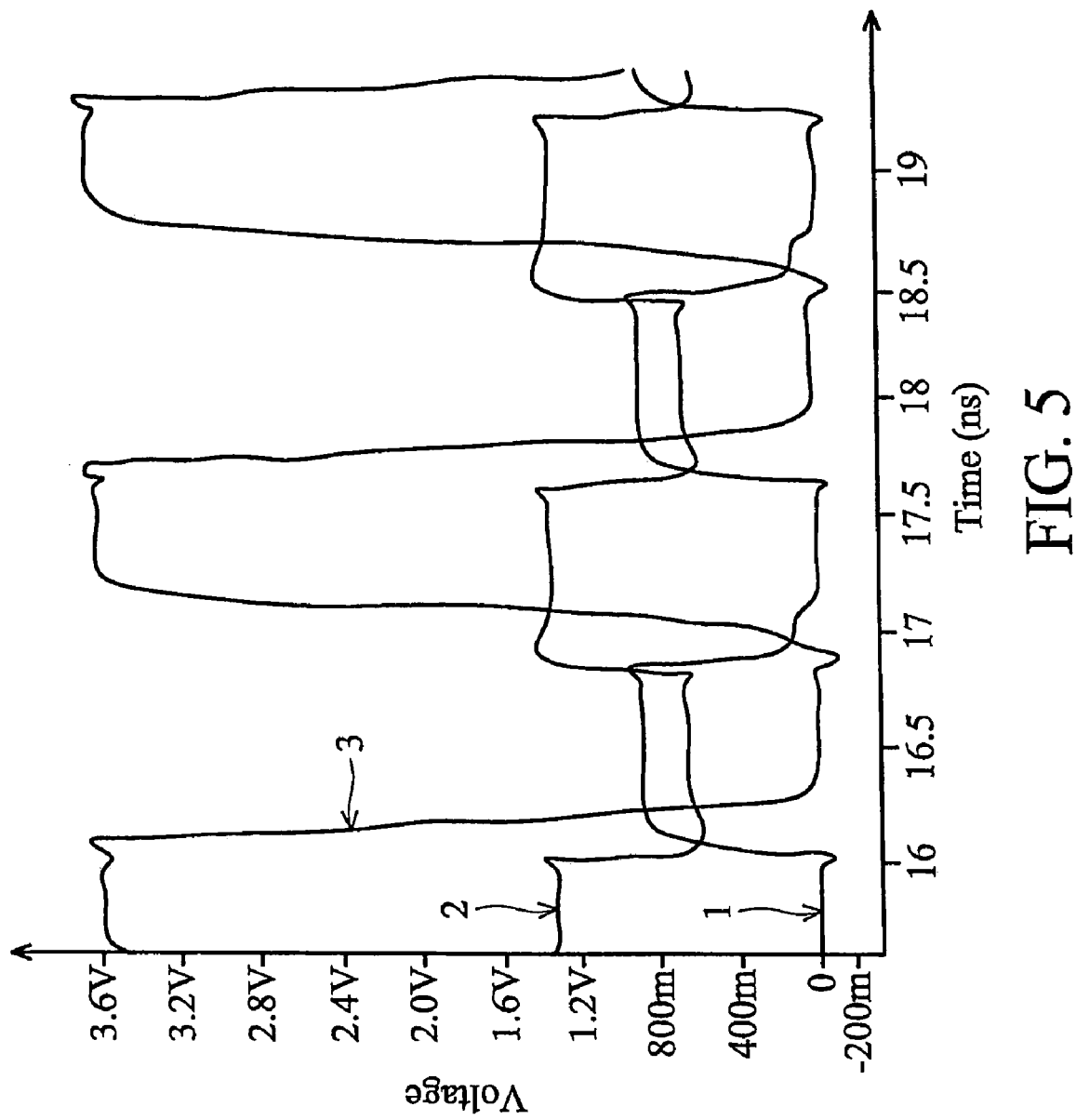
FIG. 5 illustrates the voltages at different nodes of a preferred embodiment as a function of time.

The preferred embodiment of the present invention performs correctly at a frequency higher than 1 GHz, compared to about 500 MHz for the prior circuit illustrated in FIG. 1. FIG. 5 illustrates the voltages as a function of time of a level shifter made using the preferred embodiment. The level shifter converts a 0.9V core signal to a 3.6V signal and is operated at a signal speed of 1.25 Gbps. Line 101 is the input signal at node 72, which has an amplitude of 0.9V. Line 102 is the voltage at node 88, and it is charge pumped to between about 0.65V and about 1.33V. Line 103 is the output voltage at node 90 that has an amplitude of 3.6V. It is noted that at a signal speed as high as 1.25 Gbps, the preferred embodiment is still responsive to the rapidly changed signal, and the output voltage can be fully lifted to 3.6V before it is switched down.

The preferred embodiment of the present invention has several advantages. First, it works for advanced technology (0.13 μm, 90 nm, 65 nm and lower) with low core operation voltages. The charge pumps increase the driver voltages to a desired level. If the technology advances and the core operation voltage further drops, multiple state charge pumps can further increase the driver voltages. Second, the preferred embodiments have a wide working frequency range that is from near DC to GHz level. The high frequency response is improved by speeding up the state transition. Third, it has near zero standby power consumption when there is no state transition. The result has shown that for a lower speed signal, the current drawn from VDD and VDDH are lower than about 1 μA during standby state, the peak current at transition is about 1.5 mA.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A high speed digital level shifter comprising:
a first power supply node at a first supply voltage;
a second power supply node at a second supply voltage wherein the second supply voltage is higher than the first supply voltage;
an input node configured to receive an input signal;
an output node;
a signal driver coupled to the first power supply node and to the input node wherein the signal driver has a first signal driver output node configured to output a boosted signal corresponding to the input signal and a second signal driver output node configured to output a boosted signal corresponding to an inverted input signal, wherein the signal driver comprises a first charge pump coupled to the first signal driver output node, and a second charge pump coupled to the second signal driver output node;
an output circuit coupled to the second power supply node and having a first input coupled to the first signal driver output node and a second input coupled to the second signal driver output node, and having an output coupled to the output node, wherein the output circuit comprises a first nMOS transistor and a second nMOS transistor; and
a signal stepper comprising:
a first CMOS inverter comprising two transistors with a common gate connection having a first input coupled to the input node and to the common gate connection, and a first output directly connected to a source of the first nMOS transistor; and
a second CMOS inverter comprising two transistors with a common gate connection and having a second input coupled to the first output of the first inverter and coupled to the common gate connection, and a second output directly connected to a source of the second nMOS transistor.

2. The high speed digital level shifter of claim 1 wherein said output circuit comprises:
a first pMOS transistor having a source coupled to the second power supply node and a drain coupled to a drain of the first nMOS transistor;
a second pMOS transistor having a source coupled to the second power supply node and a drain coupled to a drain of the second nMOS transistor;
wherein the first nMOS transistor has its drain coupled to the gate of the second pMOS transistor and its gate coupled to the first signal driver output node; and
wherein the second nMOS transistor has its drain coupled to the gate of the first pMOS transistor and its gate coupled to the second signal driver output node.

3. The high speed digital level shifter of claim 1 wherein:
the first charge pump comprises a first charge transistor having its gate and drain coupled to the first power supply node, a first capacitor having a first end coupled to the input node and a second end coupled to the source of the first charge transistor and to the gate of the first nMOS transistor; and
the second charge pump comprises a second charge transistor having its gate and drain coupled to the first power supply node, a second capacitor having a first end coupled to the signal driver and a second end coupled to the source of the second charge transistor and to the gate of the second nMOS transistor.

4. The high-speed digital level shifter of claim 3 wherein the first and the second capacitors are formed of pMOS transistors having their drains and sources connected.

5. The high speed digital level shifter of claim 1 wherein the first power supply voltage equals the third power supply voltage.

6. The high speed digital level shifter of claim 2 wherein the first inverter of the signal stepper comprises a first pMOS transistor having a drain directly connected to the source of the first nMOS transistor of the output circuit, and wherein the second inverter of the signal stepper comprises a second pMOS transistor having a drain directly connected to the source of the second nMOS transistor of the output circuit.

7. The high speed digital level shifter of claim 3 wherein the gate and the drain of the first charge transistor and the gate and the drain of the second charge transistor are directly connected to the first power supply node.

8. A high speed digital level shifter comprising:
a first power supply node at a first supply voltage;
a second power supply node at a second supply voltage wherein the second supply voltage is higher than the first supply voltage;
an input node configured to receive an input signal;
an output node;
a signal driver coupled to the first power supply node and to the input node wherein the signal driver has a first signal driver output node configured to output a boosted signal corresponding to the input signal and a second signal driver output node configured to output a boosted signal corresponding to an inverted input signal, wherein the signal driver comprises a first charge pump coupled to the first signal driver output node, and a second charge pump coupled to the second signal driver output node;
an output circuit coupled to the second power supply node and having a first input coupled to the first signal driver output node and a second input coupled to the second signal driver output node, and having an output coupled to the output node, wherein the output circuit comprises a first nMOS transistor and a second nMOS transistor, a first pMOS transistor having a source coupled to the second power supply node and a drain coupled to a drain of the first nMOS transistor, a second pMOS transistor having a source coupled to the second power supply node and a drain coupled to a drain of the second nMOS transistor, wherein the first nMOS transistor has its drain coupled to the gate of the second pMOS transistor and its gate coupled to the first signal driver output node and wherein the second nMOS transistor has its drain coupled to the gate of the first pMOS transistor and its gate coupled to the second signal driver output node; and
a signal stepper comprising:
a first inverter having a first input coupled to the input node and a first output directly connected to a source of the first nMOS transistor, the first inverter comprising a first pMOS transistor having a drain directly connected to the source of the first nMOS transistor of the output circuit; and
a second inverter having a second input coupled to the first output of the first inverter, and a second output directly connected to a source of the second nMOS transistor, the second inverter comprising a second pMOS transistor having a drain directly connected to the source of the second nMOS transistor of the output circuit.

9. A high speed digital level shifter, comprising:
a first power supply node at a first supply voltage;
a second power supply node at a second supply voltage wherein the second supply voltage is higher than the first supply voltage;
an input node configured to receive an input signal;
an output node;
an output circuit coupled to the second power supply node and having a first input coupled to a first signal driver output node and a second input coupled to a second signal driver output node, and having an output coupled to the output node, wherein the output circuit comprises a first nMOS transistor and a second nMOS transistor;
a signal driver coupled to the first power supply node and to the input node wherein the signal driver is configured to output a boosted signal corresponding to the input signal on the first signal driver output node and is configured to output a boosted signal corresponding to an inverted input signal on the second signal driver output node, wherein the signal driver comprises a first charge pump coupled to the first signal driver output node, the first charge pump comprising a first charge transistor having its gate and drain directly connected to the first power supply node, a first capacitor having a first end coupled to the input node and a second end coupled to the source of the first charge transistor and to the gate of the first nMOS transistor, and a second charge pump coupled to the second signal driver output node, the second charge pump comprising a second charge transistor having its gate and drain directly connected to the first power supply node, a second capacitor having a first end coupled to the signal driver and a second end coupled to the source of the second charge transistor and to the gate of the second nMOS transistor; and
a signal stepper comprising:
a first inverter having a first input coupled to the input node and a first output directly connected to a source of the first nMOS transistor; and
a second inverter having a second input coupled to the first output of the first inverter and a second output directly connected to a source of the second nMOS transistor.

\* \* \* \* \*